(12) United States Patent
Bury

(10) Patent No.: US 11,329,663 B2
(45) Date of Patent: May 10, 2022

(54) ANALOG TO DIGITAL CONVERTER

(71) Applicant: COMMSOLID GMBH, Dresden (DE)

(72) Inventor: Andreas Bury, Dresden (DE)

(73) Assignee: COMMSOLID GMBH, Dresden (DE)

( * ) Notice: Subject to any disclaimer, the term of this patent is extended or adjusted under 35 U.S.C. 154(b) by 411 days.

(21) Appl. No.: 16/476,664

(22) PCT Filed: Aug. 21, 2018

(86) PCT No.: PCT/EP2018/072511
§ 371 (c)(1),
(2) Date: Jul. 9, 2019

(87) PCT Pub. No.: WO2020/038559
PCT Pub. Date: Feb. 27, 2020

(65) Prior Publication Data
US 2021/0351782 A1 Nov. 11, 2021

(51) Int. Cl.
*H03M 3/00* (2006.01)

(52) U.S. Cl.
CPC ............. *H03M 3/32* (2013.01); *H03M 3/462* (2013.01); *H03M 3/494* (2013.01)

(58) Field of Classification Search
CPC ......... H03M 3/32; H03M 3/462; H03M 3/494
See application file for complete search history.

(56) References Cited

U.S. PATENT DOCUMENTS 4,020,332 A 4/1977 Crochiere et al.
4,509,037 A 4/1985 Harris
(Continued)

FOREIGN PATENT DOCUMENTS

| EP | 3367573 A1 | 8/2018 |
|---|---|---|
| WO | 01/97010 A2 | 12/2001 |
| WO | 2016/182901 A1 | 11/2016 |

OTHER PUBLICATIONS

International Search Report and Written Opinion issued in PCT/EP2018/072511 dated May 15, 2019.
(Continued)

*Primary Examiner* — Lam T Mai
(74) *Attorney, Agent, or Firm* — Heslin Rothenberg Farley and Mesiti PC; Nicholas Mesiti

(57) ABSTRACT

The invention relates to an analog-to-digital converter (ADC). The objective of the invention to have an analog-to-digital converter with the capability of non-equidistant sample time spacing and minimizing energy consumption will be solved by an apparatus comprising a sigma-delta modulator and a sample-time-counter, both controlled by a sample clock, a next-sample-time-computation unit configured to compute a sample-time-counter value when a next digital output sample is requested, a sample-computation-trigger unit connected to the next-sample-time-computation unit configured to compare an actual sample-time-counter value with the sample-time-counter value when the next digital output sample is requested and to trigger a computation unit for calculating a next digital sample when requested and by powering off the sigma-delta modulator in intervals where its delivered samples are not used for any computed decimator output sample. The objective is also solved by a method using the aforementioned analog-to-digital converter.

15 Claims, 4 Drawing Sheets

(56) References Cited

U.S. PATENT DOCUMENTS

Figure 1:
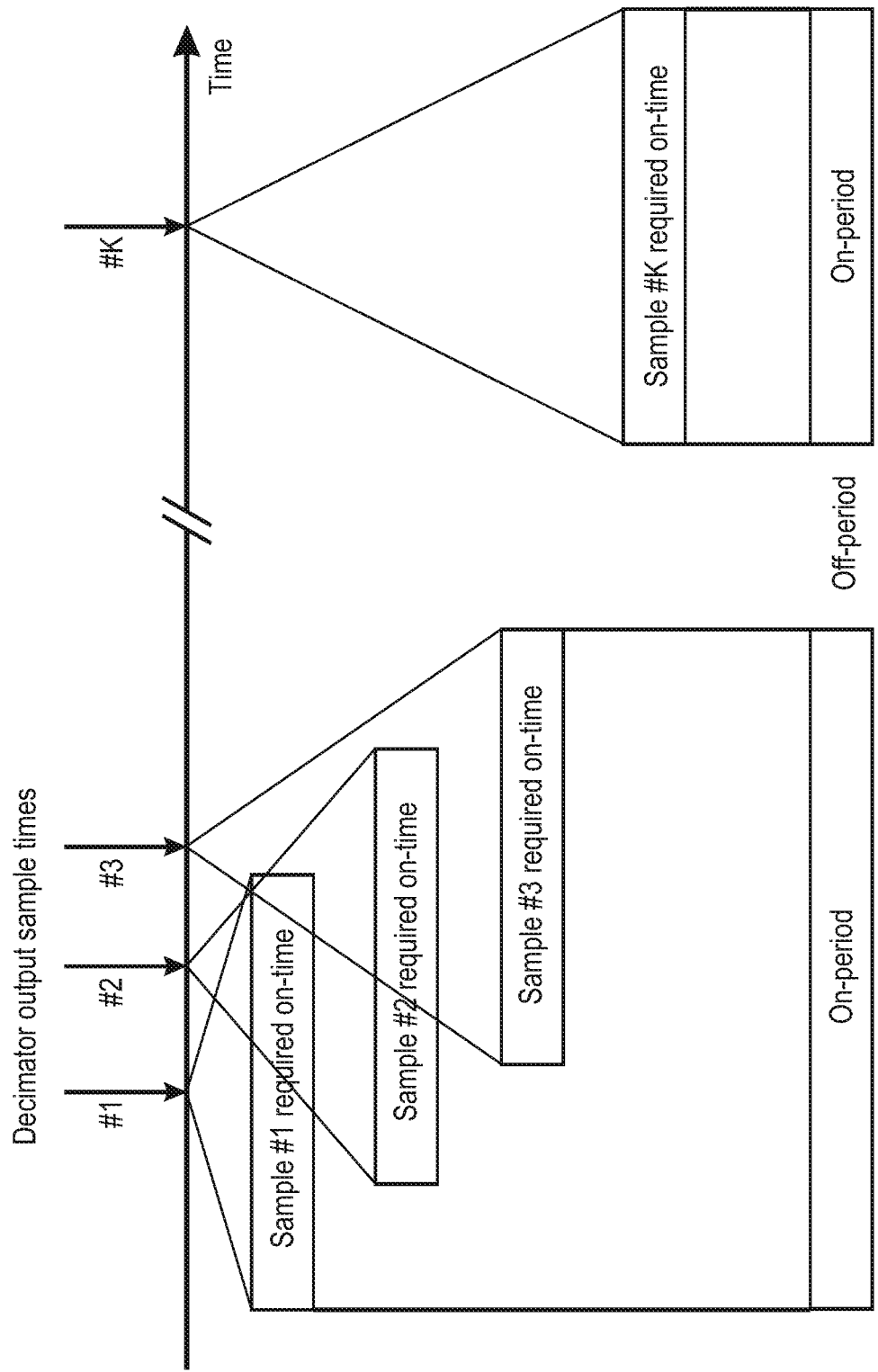

| | | | | |
|---|---|---|---|---|
| 5,084,702 | A | * | 1/1992 | Ribner ............ H03M 3/414 341/118 |
| 5,103,229 | A | * | 4/1992 | Ribner ............ H03M 3/414 341/143 |
| 5,485,152 | A | * | 1/1996 | Wilson ............ H03H 17/06 341/143 |
| 5,489,903 | A | * | 2/1996 | Wilson ............ H03H 17/06 341/143 |
| 5,497,152 | A | * | 3/1996 | Wilson ............ H03H 17/06 341/143 |
| 5,512,897 | A | * | 4/1996 | Wilson ............ H03M 3/372 341/123 |
| 5,619,202 | A | * | 4/1997 | Wilson ............ H03M 3/372 341/123 |
| 5,712,635 | A | * | 1/1998 | Wilson ............ H03H 17/06 341/123 |
| 5,892,468 | A | * | 4/1999 | Wilson ............ H03L 7/08 341/61 |
| 5,963,160 | A | * | 10/1999 | Wilson ............ H03H 17/06 341/143 |
| 6,987,953 | B2 | * | 1/2006 | Morris ............ H04B 1/0483 341/61 |
| 7,365,667 | B1 | | 4/2008 | Nanda et al. |
| 7,382,300 | B1 | | 6/2008 | Nanda et al. |
| 7,489,263 | B1 | * | 2/2009 | Drakshapalli ............ H03M 3/35 341/108 |
| 7,492,296 | B1 | * | 2/2009 | Drakshapalli ............ H03M 3/35 341/122 |
| 9,235,294 | B2 | | 1/2016 | Poulsen |
| 2008/0155355 | A1 | | 6/2008 | Boskovic |
| 2008/0238498 | A1 | * | 10/2008 | Lam ............ H03L 7/16 327/117 |
| 2011/0270552 | A1 | | 11/2011 | Abe |
| 2012/0066551 | A1 | | 3/2012 | Palus et al. |
| 2021/0336643 | A1 | * | 10/2021 | Bury ............ H03M 3/458 |

OTHER PUBLICATIONS

Po-Chiao Lee, "Incremental Delta-Sigma A/D Converter for Ion-Sensitive System Application" IEEE Asia Pacific Conference, Jun. 12, 2010, pp. 1035-1038.

Michael A.P. Pertijs, et al., "A CMOS Smart Temperature Sensor With a 3o Inaccuracy of +−0.1 degree C From −55 degree C to 125 degree C" IEEE Journal of Solid State Circuits, vol. 40, No. 12, Dec. 2005, pp. 2805-2815.

* cited by examiner

ANALOG TO DIGITAL CONVERTER

CROSS REFERENCE TO RELATED APPLICATIONS

This application is the National Phase filing under 35 U.S.C. § 371 of International Application No.: PCT/EP2018/072511, filed on Aug. 21, 2018. The contents of the prior application is hereby incorporated by reference herein in its entirety.

The invention relates to an analog-to-digital converter using a sigma-delta modulator.

BACKGROUND ART

Sigma-delta analog-to-digital converters operate at significant oversampling and employ digital decimation filters to deliver a signal at the required sample rate. Typically, the decimation filter comprises multiple decimation states, e.g., using so-called cascaded integrator comb (CIC) filters, delivering samples spaced equidistantly in time.

In wireless radio transmission it is common to operate at a fixed ratio between carrier frequency and sampling frequency. At the receiver this may be achieved by deriving both the carrier frequency clock as well as the sample clock from a common reference oscillator. Given that the carrier frequency value is known at the receiver, by tuning the carrier frequency offset to zero via reference oscillator frequency change, it is also possible to exactly meet the correct sampling frequency. This holds exactly in static scenarios without distance change between transmitter and receiver and typically good enough in mobile scenarios. Alternatively to tuning a common reference oscillator, a fractional re-sampler may take care of sampling frequency correction, which is a dedicated extra functional block.

Furthermore, in baseband receivers for OFDM (Orthogonal Frequency-Division Multiplexing) reception the FFT (fast Fourier transformation) portions related to individual OFDM symbols would be cut out of the signal stream, typically leaving the entire signal processing prior to this point running, including analog-to-digital conversion (ADC) and related decimation filtering, which is mandatory for sigma-delta (SD) type of ADCs. In other words, samples of the discarded cyclic prefixes are actually computed beforehand, which might be regarded as a waste of energy. In the LTE standard a so-called cyclic prefix (CP) is used and inserted into the OFDM symbol in order to obtain a time window of orthogonal data transmission without inter-carrier and inter-symbol interference. Thus, a cyclic prefix is a guard band that is made between the LTE symbols.

The downlink signal format definition for LTE and also narrow-band LTE is compatible to a sampling frequency of 1920 kHz. At this sampling frequency, the so-called "normal cyclic prefix" has a duration of either 9 or 10 samples, respectively for certain OFDM symbols. Lower sampling frequencies result in a fractional sample spacing. Standard multi-mode receivers for LTE Cat-M and narrow-band LTE would operate at 1920 kHz in both modes and use a partial FFT in case of narrowband LTE operation, which is suboptimum with respect to power efficiency.

The narrowband LTE downlink signal utilizes a bandwidth of 180 kHz. Using a sampling frequency as low as 240 kHz it is desirable to achieve a low power consumption. However, when using equidistant sampling at this rate, the cyclic prefixes have non-integer sample durations.

Therefore, it is desirable to have a simple decimation filter which can insert pauses of non-integer numbers of samples. So, it is desirable to save energy during time gaps when no received sample is needed.

Although, a crystal oscillator without voltage control achieves better phase noise performance compared to a controllable counterpart, which is desirable when targeting the highest coverage class, where operation at very low signal-to-noise-ration (SNR) requires coherent combining across long signal durations. Coverage classes are defined for different maximum supported signal attenuation between transmitter and receiver. For example, the highest coverage class is the one supporting 164 dB of attenuation between base station and user equipment antennas. However, when using such type of oscillator, the sampling frequency can no longer be locked to the radio frequency. Some means of fractional resampling helps to lock the sampling clock to the carrier frequency. Such means is for example a fractional re-sampler consisting of a polyphase filter and a linear interpolator.

So, a simple analog-to-digital converter that can realize and satisfy the above requirements is wanted.

SUMMARY OF THE INVENTION

The objective of the invention will be solved by an analog-to-digital converter comprising a sigma-delta modulator and a sample-time-counter, both controlled by a sample clock a next-sample-time computation unit configured to compute a sample-time-counter value when a next digital output sample is requested, a sample-computation-trigger unit connected to the next-sample-time computation unit configured to compare an actual sample-time-counter value with the sample-time-counter value when the next digital output sample is requested and to trigger a computation unit for calculating a next digital sample when requested and by powering off the sigma-delta modulator in intervals where its delivered samples are not used for any computed decimator output sample.

In a preferred embodiment of the invention the computation unit comprises an output-compute-counter unit, a sample buffer and an output-sample accumulator, whereas the output-compute-counter unit (8) and output-sample accumulator (9) are triggered in dependence of a difference between the actual sample-time-counter value and the next sample-time-counter value, whereas the output-sample accumulator is configured to compute digital output samples in dependence of a read filter impulse response sample by sample from a filter coefficient memory and an accumulation of said samples after multiplication with the related digital output value of the sigma-delta modulator read from the sample buffer at certain values of the sample-time-counter.

And in another embodiment of the invention a sigma-delta modulator power control unit powers on or off the sigma-delta modulator according to a next digital sample request.

In another further embodiment of the invention an RF power control unit powers on or off the RF receiver chain or part of the RF receiver chain according to a next digital sample request. A part of the receiver chain could be a low noise amplifier (LNA), a mixer, a local oscillator (LO) comprising a phase-locked-loop (PLL) or a variable gain amplifier (VGA), all of them or only parts or single components of the receiver chain can be powered on or off.

And in another embodiment of the invention, the decimation is split into a pre-decimation followed by the decimation method described above.

In other words, the proposed analog-to-digital converter comprises the following: A one-step decimation from the high sigma-delta modulator output sampling frequency to the receiver input sampling frequency should be performed. Thus, each output sample is computed as a weighted sum over a range of input samples, corresponding to the filter length. The choice of the sigma-delta modulator sampling frequency should be a sufficiently large multiple of all supported receiver input sample frequencies, such that a sufficiently large output signal-to-noise ratio (SNR) by means of noise shaping and subsequent (one-step decimation) filtering will be achieved. In a receiver application, the receiver would request filtered samples either equidistantly spaced, e.g., one output sample every K input samples or non-equidistantly spaced, e.g., when inserting a time gap to discard the OFDM cyclic prefix. So, there is a possibility to select the time position for decimator output sample computation at time granularity of the much higher input sample frequency. There are also means to determine time intervals where no input sample to the decimator is needed, and further controlling means to power off the sigma-delta modulator circuitry. A sample-computation-trigger unit is such a mean that is connected to the next-sample-time-computation unit configured to compare an actual sample-time-counter value with the sample-time-counter value when the next digital output sample is requested, whereas the sample-computation-trigger unit triggers a sigma-delta modulator power control unit, an output-compute-counter unit as well as an output-sample accumulator in dependence of a difference between the actual sample-time-counter value and the next sample-time-counter value. Background is that around each decimator output sample, a number of input samples must be available to support the length of the decimation filter. A power switch is controlled by the result of comparing a sample-time-counter operating at the high rate against the time window required to compute an output sample (filter response duration plus sigma delta modulator settling time). As long as the time distance from sample to sample is shorter than the time window duration, the switch will keep the circuitry powered on. Furthermore, there are means to artificially move the point of time of output sample computation by +/−1 input sample of time, in order to tune the output sampling frequency to compensate for sample frequency offset. The background is that an equidistant sampling at a spacing of K input samples produces a fixed sampling rate. By duplicating one input sample every N output samples, the average sample spacing decreases from "every K input samples" to "every K−(1/K/N)". Vice versa, by removing one input sample every N output samples, the average sample spacing increases from "every K input samples" to "every K+(1/K/N)". The means to achieve this is a sample counter and the possibility to either skip or duplicate an input sample. There is also a decimator control circuitry to request portions of equidistantly sampled output signal separated by arbitrarily selected time gaps. The circuitry has to be implemented once in a decimator for complex in-phase (I) and quadrature phase (Q) signals, and for the case of multiple receive antennas. All may be shared, except the sample computation path consisting of the sigma-delta modulator, sample buffer, sample multiplier and output sample accumulator. By this a very flexible and easily adapted solution achieves very low power consumption and small silicon area.

In further embodiments of the invention the sigma-delta modulator is a single-bit or a multi-bit and/or a continuous-time or discrete-time and/or a bandpass or baseband sigma-delta modulator. The type is selectable in dependence of the application. A sample clock controls the sigma-delta modulator and a sample-time-counter. The digital output values of the sigma-delta modulator are stored in a sample buffer, under control of the sample-time-counter.

In another embodiment the next-sample-time-computation unit is activated by a request format starting at time point t and consisting in delivering N samples of equidistant spacing T and time ticks of the sample clock. Meaning that a sample computation request asks for digital output samples to be computed at certain values of the sample time counter by using a simple format of such a request that consists in delivering N samples of equidistant spacing T time ticks of the sample clock. More complex, implementation specific request formats are possible, e.g., to skip the cyclic prefix in OFDM, or to obtain a non-integer sampling frequency ratio.

The next-sample-time-computation unit computes the sample time counter value when the next output sample is requested. For equidistant sampling, the next sample time is the current sample time plus an offset K. In OFDM, a one-time larger offset, e.g., NCP*K, may be used to skip the cyclic prefix, in which case the sigma-delta modulator may get powered off.

The sample-computation-trigger unit serves two purposes, both based upon comparing the actual sample time counter value with the sample time counter value when the next sample is requested: If the delta of the two values falls below the filter length, it requests the sigma-delta modulator power Control to turn on the sigma-delta modulator, and if the values match, it triggers computation of the next output sample. So in a preferred embodiment the sample-computation-trigger unit powers on the sigma-delta modulator if the difference of the actual sample-time-counter value and the sample-time-counter value when the next digital output sample is requested falls below a filter length.

In another preferred embodiment the sample-computation-trigger unit triggers the computation of the next digital output sample if the actual sample-time-counter value and the sample-time-counter value when the next digital output sample is requested matches.

In an embodiment of the invention the sample-time-counter value is a current sampling time plus an offset K.

And in a preferred embodiment a one-time larger offset is used to skip a portion of the signal, in which case the sigma-delta modulator is powered off. Multiple sample requests will be configured, supporting cases where the time delta between the last sample of request 0, $t_0+(K_0-1)*T_0$, and the 1st sample of request 1, $t_1$, is different from $T_0$.

Also, request 1 may use a sample period T1 which is distinct from T0.

In a further embodiment a shape of the filter is varied by a change of coefficients stored in the filter coefficient memory and a length of the filter. The proposed solution supports simple variation of the filter shape by change of coefficients and length of the filter itself.

The proposed solution for power control of the sigma-delta modulator can also be extended further, beyond control of the sigma-delta modulator, e.g., to control a radio frequency mixer, low noise amplifier and further amplification stages. So it can be used in low power receivers, e.g., in modems for sensor networks or modems employing energy harvesting.

The objective of the invention will be also solved by a method for converting an analog signal into a digital signal using the analog-to-digital converter according to claims 1 to 10, wherein the method comprising the following steps:
using a sigma-delta modulator to produce a quantized, noise-shaped signal at a large sampling frequency, delivering output samples at requested output time positions by computing weighted sums over appropriate ranges of input samples according to the filter length, powering off the sigma-delta modulator when no filtered sample is requested in an off-period.

With other words the method uses an one-step decimation filtering from a high sigma-delta modulator output sampling frequency to a lower receiver input sampling frequency by computing weighted sums over ranges of input samples according to the filter length, whereas the output sample times and thus the associated ranges of input samples are determined as requested via configuration, N samples of equidistant spacing T starting at time t.

In a preferred embodiment of the inventive method a baseband receiver requests the filtered samples equidistantly spaced or non-equidistantly spaced, whereas the sigma-delta modulator as well as other components of the RF side can be powered off when no sample is requested in order to save energy and to reduce the overall power consumption.

BRIEF DESCRIPTION OF THE DRAWING FIGURES

The invention will be explained in more detail using an exemplary embodiment.

The appended drawing shows

Figure 2:
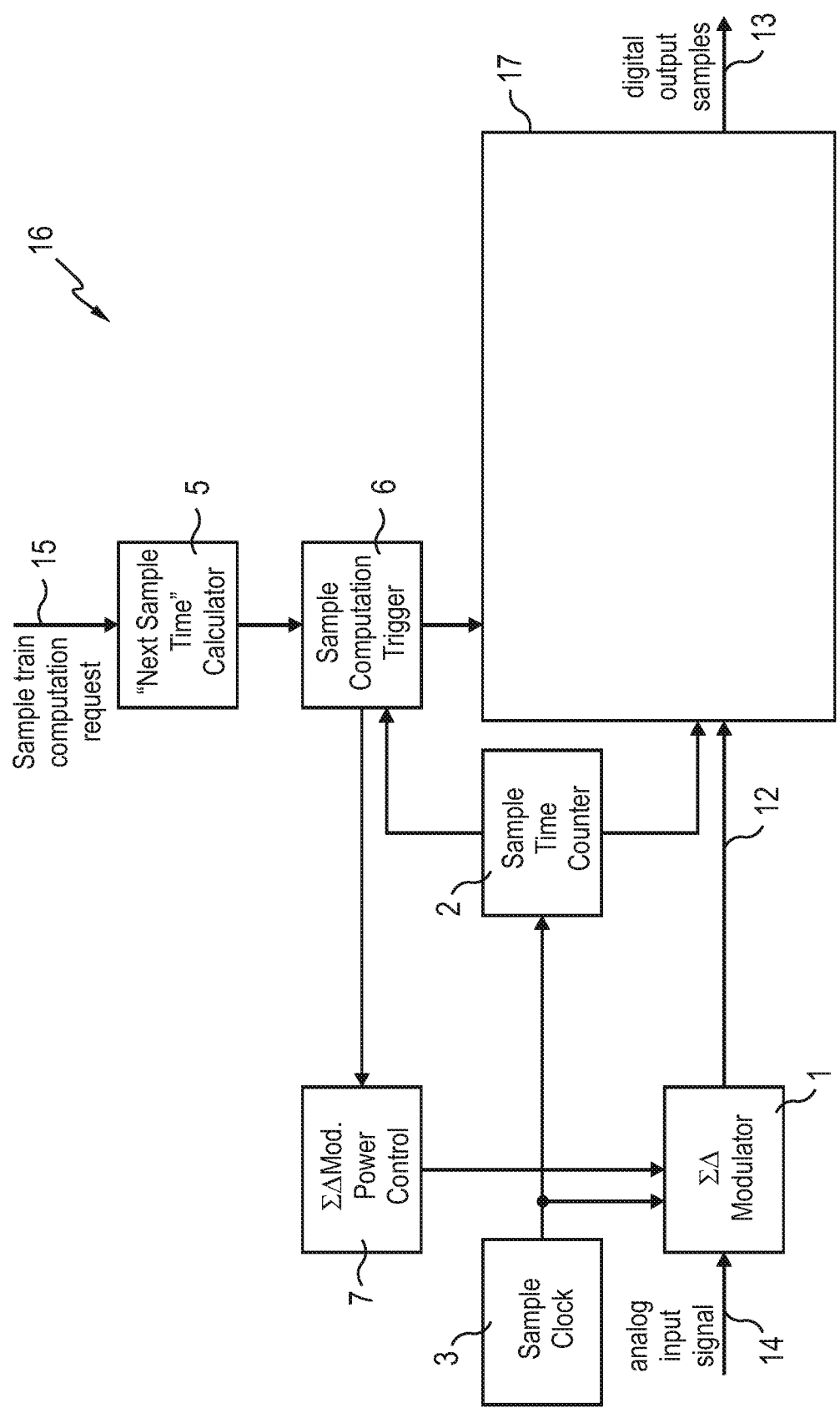
Figure 3:
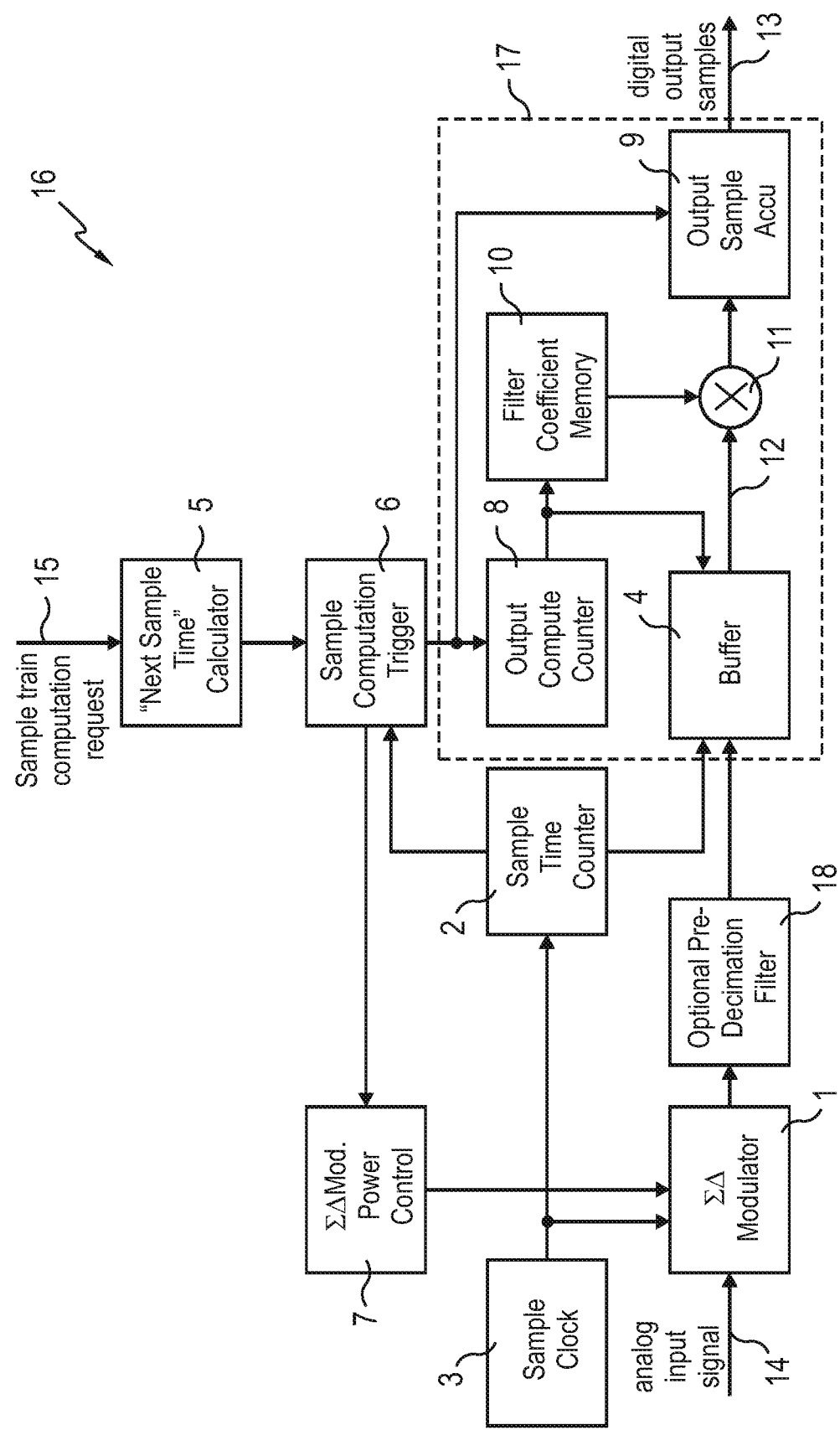
Figure 4:
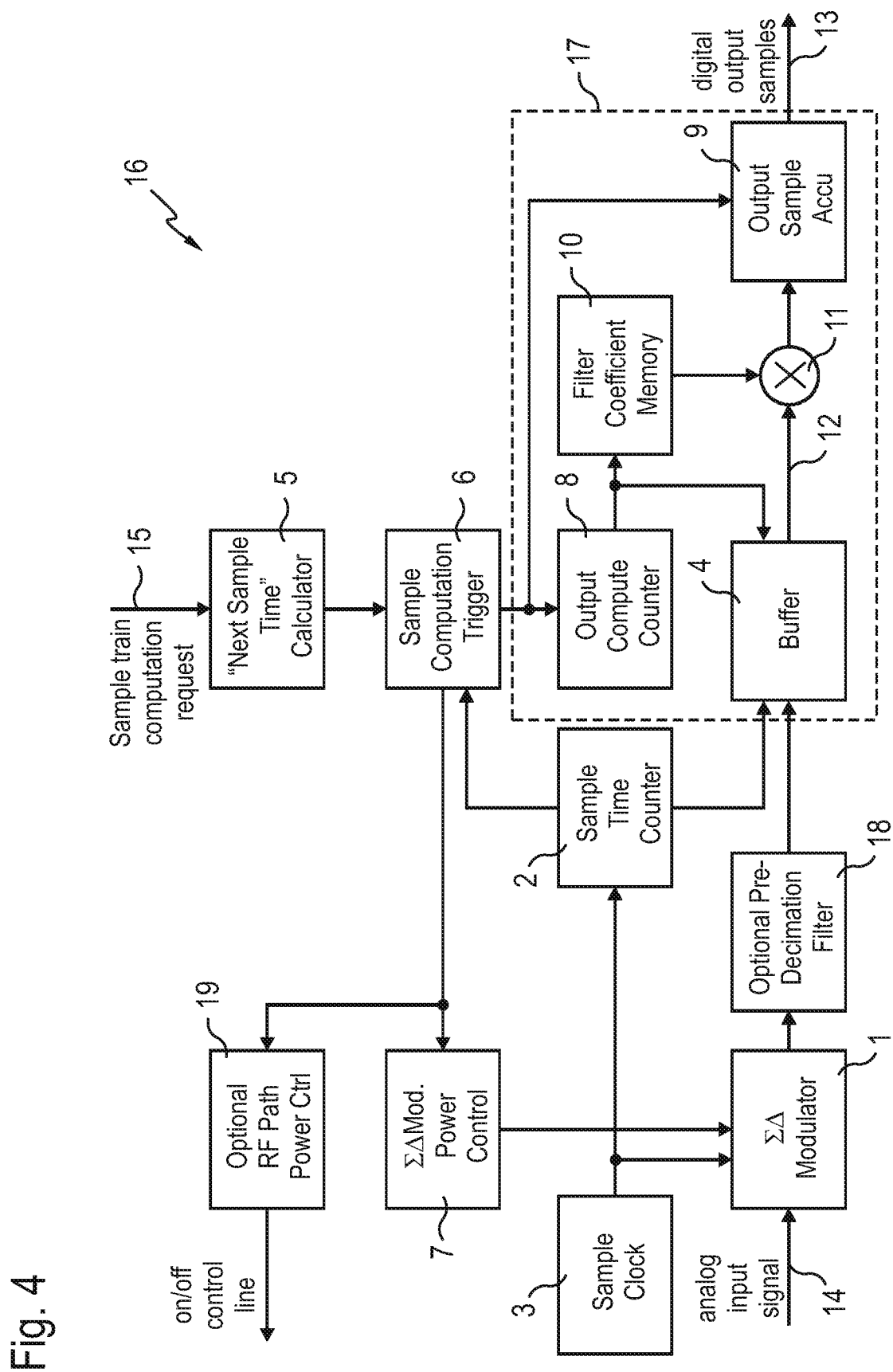

FIG. 1 Schematical drawing of a timeline, with on- and off-periods and where samples are requested in the on-period and no samples are requested in the off-period;

FIG. 2 An analog-to digital converter with the inventive extension of the computation unit;

FIG. 3 An analog-to digital converter of FIG. 2 with a detailed view of the computation unit;

FIG. 4 An analog-to digital converter with an optional RF path for power control and an optional pre-decimation filter to minimize overall decimation filtering complexity and power consumption.

DETAILED DESCRIPTION

FIG. 1 shows a timeline with on- and off-periods, whereas samples are requested in the on-period. In the off-period no samples are requested. In such off-periods it is possible to power off the sigma-delta modulator 1 and other components of the RF side, because they are not needed when no samples are requested. This results in saving energy and a reduction in the overall power consumption. With the inventive analog-to-digital converter it is possible to request output samples at any time, meaning at an arbitrary point in time whenever it is desired. An advantage is that this is not restricted to equidistant time positions as with standard A/D converters.

FIG. 2 shows an analog-to-digital converter 16 which receives a continuous-time analog signal 14 and delivers a discrete-time digital signal 13. A sample clock 3 controls the sigma-delta modulator 1 and a sample time counter 2. The samples are put out by the computation unit 17 whenever the comparison of the actual sample-time-counter value with the sample-time-counter value when the next sample is requested matches, meaning when the delta of the two values is zero. So, the sigma-delta modulator power control 7 turns on the sigma-delta modulator 1, if the delta of the two values falls below a filter length of the computation unit 17, and if the values match, it triggers the computation of the next output sample.

FIG. 3 shows the analog-to-digital converter 16 with a possible embodiment of the computation unit 17. FIG. 3 shows an analog-to-digital converter 16 which receives a continuous-time analog signal 14 and delivers a discrete-time digital signal 13. A sample clock 3 controls the sigma-delta modulator 1 and a sample time counter 2. Furthermore, the sigma-delta modulator can be connected to an optional pre-decimation filter 18. Inserting a simple pre-decimation filter 18 allows minimizing the overall implementation complexity and power consumption of the decimation filter as a whole. The digital output values 12 of the sigma-delta modulator 1 are stored in a sample buffer 4, under control of the sample time counter 2. A sample computation request 15 asks for digital output samples 13 to be computed at certain values of the sample-time-counter 2. A simple format of such a request consists in delivering N samples of equidistant spacing T time ticks of the sample clock. More complex, implementation specific request formats are possible, e.g., to skip the cyclic prefix in OFDM, or to obtain a non-integer sampling frequency ratio. The next-sample-time-computation unit 5 computes the sample-time-counter value when the next output sample is requested. For equidistant sampling, the next sample time is the current sample time plus an offset K. In OFDM, a one-time larger offset, e.g., NCP*K, may be used to skip the cyclic prefix, in which case the sigma-delta converter may get powered off. The sample-computation-trigger unit 6 serves two purposes, both based upon comparing the actual sample-time-counter value with the sample-time-counter value when the next sample is requested: If the delta of the two values falls below the filter length, it requests the sigma-delta modulator power control 7 to turn on the sigma-delta modulator 1, and if the values match, it triggers computation of the next output sample. The actual output sample computation consists in reading the filter impulse response sample by sample from the filter coefficient memory 10 and accumulating 9 after multiplication 11 with the related sample value read from the buffer 4, given that each output sample is a weighted sum over a set of input samples stored in the sample buffer 4.

The sigma-delta modulator 1 could be single-bit or multi-bit, continuous-time or discrete-time, baseband or bandpass sampling of any order. Compared to related art, the proposed solution requires only a small amount of logic to implement the required functionality, it is able to perform the required functionality at very low power consumption, it offers versatile use, and it supports simple variation of the filter shape by change of coefficients and length of the computation unit 17.

FIG. 4 shows another embodiment of the invention. The analog-to-digital converter can additionally comprise an optional RF path power control unit which is triggered by the sample-computation trigger unit 6 and is used to power on or off the entire RF receive path, or parts of the RF receive path.

REFERENCE SIGNS 1 sigma-delta modulator
2 sample-time-counter
3 sample clock
4 sample buffer
5 next-sample-time-computation unit
6 sample-computation-trigger unit
7 sigma-delta modulator power control unit
8 output-compute-counter unit
9 output-sample accumulator
10 filter coefficient memory
11 multiplication
12 digital output value of the sigma-delta modulator 13 digital output samples
14 analog input signal
15 sample computation request
16 analog-to-digital converter
17 computation unit
18 pre-decimation filter
19 RF path power control unit

The invention claimed is:

1. An analog-to-digital converter comprising a sigma-delta modulator and a sample-time-counter, both controlled by a sample clock, a next-sample-time computation unit configured to compute a sample-time-counter value when a next digital output sample is requested, a sample-computation-trigger unit connected to the next-sample-time computation unit configured to compare an actual sample-time-counter value with the sample-time-counter value when the next digital output sample is requested and to trigger a computation unit for calculating a next digital sample when requested, wherein the computation unit comprises an output-compute-counter unit, a sample buffer configured to store digital output values of the sigma-delta modulator under control of the sample time counter and an output-sample accumulator, whereas the output-compute-counter unit and output-sample accumulator are triggered in dependence of a difference between the actual sample-time-counter value and the next sample-time-counter value, whereas the output-sample accumulator is configured to compute digital output samples in dependence of a filter response read sample by sample from a filter coefficient memory and an accumulation of said samples after multiplication with the related digital output value of the sigma-delta modulator read from the buffer at certain values of the sample-time-counter.

2. An analog-to-digital converter according to claim 1, wherein a sigma-delta modulator power control unit powers on or off the sigma-delta modulator according to a next digital sample request.

3. An analog-to-digital converter according to claim 1, wherein an RF power control unit powers on or off the RF receiver chain or a part of the RF receiver chain according to a next digital sample request.

4. An analog-to-digital converter according to claim 1, wherein the sigma-delta modulator is a single-bit or a multi-bit and/or a continuous-time or discrete-time and/or a bandpass or baseband sigma-delta modulator.

5. An analog-to-digital converter according to claim 1, wherein the next-sample-time-computation unit is activated by a request format consisting in delivering N samples of equidistant spacing T starting at time point t.

6. An analog-to-digital converter according to claim 1, wherein the sample-computation-trigger unit powers on the sigma-delta modulator if the difference of the actual sample-time-counter value and the sample-time-counter value when the next digital output sample is requested falls below a threshold value.

7. An analog-to-digital converter according to claim 1, wherein the sample-computation-trigger unit triggers the computation of the next digital output sample if the actual sample-time-counter value and the sample-time-counter value when the next digital output sample is requested matches.

8. An analog-to-digital converter according to claim 1, wherein the sample-time-counter value is a current sampling time plus an offset K.

9. An analog-to-digital converter according to claim 1, wherein a one-time larger offset is used to skip a portion of the signal, in which case the sigma-delta modulator is powered off.

10. An analog-to-digital converter according to claim 1, wherein a shape of the filter is varied by a change of coefficients stored in the filter coefficient memory and a length of the filter.

11. A method for converting an analog signal into a digital signal using the analog-to-digital converter according to claim 1, wherein the method comprising the following steps:
using a sigma-delta modulator to produce a quantized, noise-shaped signal at a large sampling frequency,
delivering output samples at requested output sample time positions by computing weighted sums over appropriate ranges of input samples according to the filter length,
optionally powering off the sigma-delta modulator when no filtered sample is requested in an off-period.

12. The method for converting an analog signal into a digital signal according to claim 11, wherein the method comprises the step that a receiver radio frequency path, or part of a receiver radio frequency path prior to the sigma-delta modulator are powered off.

13. The method for converting an analog signal into a digital signal according to claim 11, wherein a receiver requests the filtered samples equidistantly spaced or non-equidistantly spaced.

14. An analog-to-digital converter comprising a sigma-delta modulator and a sample-time-counter, both controlled by a sample clock, a next-sample-time computation unit configured to compute a sample-time-counter value when a next digital output sample is requested, a sample-computation-trigger unit connected to the next-sample-time computation unit configured to compare an actual sample-time-counter value with the sample-time-counter value when the next digital output sample is requested and to trigger a computation unit for calculating a next digital sample when requested, wherein
(i) a sigma-delta modulator power control unit powers on or off the sigma-delta modulator according to a next digital sample request, or
(ii) an RF power control unit powers on or off the RF receiver chain or a part of the RF receiver chain according to a next digital sample request.

15. An analog-to-digital converter comprising a sigma-delta modulator and a sample-time-counter, both controlled by a sample clock, a next-sample-time computation unit configured to compute a sample-time-counter value when a next digital output sample is requested, a sample-computation-trigger unit connected to the next-sample-time computation unit configured to compare an actual sample-time-counter value with the sample-time-counter value when the next digital output sample is requested and to trigger a computation unit for calculating a next digital sample when requested, wherein
(i) the sample-computation-trigger unit powers on the sigma-delta modulator if the difference of the actual sample-time-counter value and the sample-time-counter value when the next digital output sample is requested falls below a threshold value,
(ii) the sample-time-counter value is a current sampling time plus an offset K, or
(iii) a one-time larger offset is used to skip a portion of the signal, in which case the sigma-delta modulator is powered off.

* * * * *